United States Patent [19]

Akaki et al.

[11] Patent Number: 4,975,351
[45] Date of Patent: Dec. 4, 1990

[54] POSITIVE-TYPE PHOTOSENSITIVE ELECTRODEPOSITION COATING COMPOSITION WITH O-QUINONE DIAZIDE SULFONYL AMIDE POLYMER

[75] Inventors: Yuu Akaki, Hiratsuka; Kenji Seko, Yokosuka; Toshio Kondo, Fujisawa; Naozumi Iwasawa, Hiratsuka, all of Japan

[73] Assignee: Kansai Paint Co., Ltd., Hyogo, Japan

[21] Appl. No.: 268,547

[22] Filed: Nov. 7, 1988

[30] Foreign Application Priority Data

Nov. 6, 1987 [JP] Japan .................. 62-279288

[51] Int. Cl.⁵ .................. G03C 1/54; G03F 7/023
[52] U.S. Cl. .................. 430/190; 430/165; 430/166; 430/168; 430/192; 430/193; 430/326
[58] Field of Search .................. 430/190, 193, 192, 166

[56] References Cited

U.S. PATENT DOCUMENTS

| | | | |
|---|---|---|---|
| 3,046,122 | 7/1962 | Sus | 430/300 |
| 3,130,049 | 4/1964 | Neugebauer et al. | 430/193 |
| 3,188,210 | 6/1965 | Fritz et al. | 430/193 |
| 3,201,239 | 8/1965 | Neugebauer et al. | 430/193 |
| 3,785,825 | 1/1974 | Deutsch et al. | 430/192 |
| 3,859,099 | 1/1975 | Petropoulos et al. | 430/190 |
| 3,902,906 | 9/1975 | Iwama et al. | 430/190 |
| 4,189,320 | 2/1980 | Hsieh | 430/192 |
| 4,289,838 | 9/1981 | Rowe et al. | 430/192 |
| 4,342,820 | 8/1982 | Kinashi et al. | 430/166 |
| 4,632,900 | 12/1986 | Demmer et al. | 430/190 |

*Primary Examiner*—Charles L. Bowers, Jr.
*Attorney, Agent, or Firm*—Wenderoth, Lind & Ponack

[57] ABSTRACT

A positive-type photosensitive electrodeposition coating composition comprising as a main component a water-soluble or water-dispersible resin containing modified quinonediazidesulfone units represented by the following formula (I)

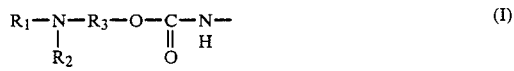

wherein $R_1$ represents

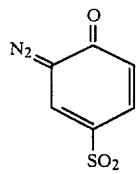

or

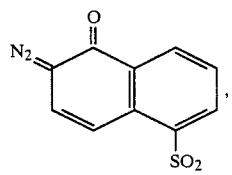

$R_2$ represents a hydrogen atom, an alkyl group, a cycloalkyl group or an alkyl ether group, and
$R_3$ represents an alkylene group, a cycloalkylene group or an alkylene ether group, in the molecule.

12 Claims, No Drawings

POSITIVE-TYPE PHOTOSENSITIVE ELECTRODEPOSITION COATING COMPOSITION WITH O-QUINONE DIAZIDE SULFONYL AMIDE POLYMER

This invention relates to a positive-type photosensitive electrodeposition coating composition, and more specifically, to an anionic or cationic electrodeposition coating composition suitable for forming a printed wiring photoresist by coating a copper-clad laminated plate by electrodeposition to form a non-tacky smooth film whose portion exposed to ultraviolet light through a positive can be washed away with a developing solution.

In the prior art, a printed wiring board for use in an integrated circuit or the like is formed by copper-plating a laminated plate obtained by cladding an insulator with a copper foil, laminating a photosensitive film, overlaying a photographic negative on it, exposing the photosensitive film through the negative, removing the unexposed portion, etching away the unnecessary copper foil from the circuit pattern, and thereafter removing the photosensitive film on the circuit pattern. Since the photosensitive film is generally as thick as 50 micrometers, the circuit pattern formed by exposure and development is not sharp, and moreover, it is difficult to laminate the photosensitive film uniformly to the surface of the copper foil. In particular, it is almost impossible to cover the through-hole portions with the photosensitive film.

A method is also known to form a circuit pattern for printed wiring which comprises applying an etching resist ink to a copper-clad laminated plate having a through-hole portion by screen printing, etching the laminated plate to remove copper from the non-printed portion, and removing the resist ink in the printed portion. According to this method, the ink is difficult to coat on the through-hole portion, and the copper in the through-hole portion is frequently removed by the etching treatment. To avoid this, it is also the practice to embed an organic material in the through-hole portion so as to prevent the copper in the through-hole portion from being removed by the etching treatment, and finally remove the organic material. This method, however, has the defect that the cost of the circuit plate finally obtained is high and the circuit pattern has low sharpness.

As improvements over these prior methods, U.S. Pat. Nos. 4,632,900 and 4,673,458 disclose a method which comprises forming a positive-type photosensitive resin resist on a printed wiring board having a throughhole portion, overlaying a photographic positive on it, exposing the board through the positive, and removing the exposed portion with an aqueous alkaline solution to form an image. Since according to this method, a coating can be formed easily on the through-hole portion by electrodeposition and the unexposed portion remains as a resist coating, a printed wiring board having excellent resolution can be obtained.

In the above-cited U.S. Pat. No. 4,632,900, polyoxymethylene polymer, o-nitrocarbinol ester, o-nitrophenyl acetal, and a quinonediazidesulfonyl ester of novolak resin are used as the resin in the resin composition for forming the photosensitive resin resist by electrodeposition. In U.S. Pat. No. 4,673,458, a resin obtained by esterifying a hydroxyl group contained in an unsaturated monomer with an acid group contained in naphthoquinone diazidesulfonic acid, and copolymerizing the resulting unsaturated monomer with another unsaturated monomer is used as the above resin. However, the former method cannot produce a high-density fine pattern circuit board of sufficient reliability whichever resin may be used. Moreover, since the electrodeposition paint has insufficient stability, flocculation is liable to occur and tends to cause filter clogging or imperfections on the coated surface upon long-term running of the electrodeposition bath. In the latter method, a photosensitive naphthoquinone diazide group is introduced into the resin through an ester group. Hence, when the electrodeposition is carried out over a long period of time (the turnover of the electrodeposition paint is long), the ester group in the resin is easily hydrolyzed by a hydrolytic substance such as water, an acid, a base or an alcohol to degrade the resin frequently. As a result, the resin component flocculates in the electrodeposition bath or precipitates at the bottom of the bath. This causes filter clogging or greatly varies the electrodeposition characteristics such as application voltage. Alternatively, abnormal electrodeposition such as pin holing occurs, and the electrodeposition coating bath becomes difficult to control. Moreover, the coated film formed from the electrodeposition bath has poor smoothness and alkali developability, and it is impossible to obtain a printed wiring board having excellent resolution.

It is an object of this invention to solve the aforesaid problems in the preparation of printed wiring boards, and to provide an electrodeposition coating composition for forming a positive photoresist, which has excellent sensitiveness to ultraviolet light, can form a developable uniform coated film on the surface or the through-hole portion of a copper-clad plate, and can give an electrodeposition coating bath having good stability over a long period of time.

According to this invention, there is provided a positive-type photosensitive electrodeposition coating composition comprising as a main component a water-soluble or water-dispersible resin containing modified quinone diazide sulfone units represented by the following formula (I)

wherein $R_1$ represents

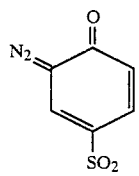

or

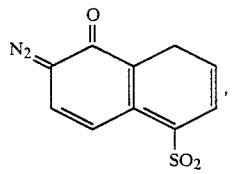

$R_2$ represents a hydrogen atom, an alkyl group, a cycloalkyl group or an alkyl ether group, and R₃ represents an alkylene group, a cycloalkylene group or an alkylene ether group, in the molecule.

The "alkyl group" for R₂ in formula (I) may be linear or branched, and examples include methyl, ethyl, n-propyl, isopropyl, n-butyl, isobutyl, sec-butyl, tert-butyl, n-pentyl, isopentyl, tert-pentyl, neopentyl, n-hexyl, isohexyl, 1-methylpentyl, 2-methylpentyl, n-heptyl, 5-methylhexyl, n-octyl, n-nonyl, n-decyl, dodecyl, tridecyl and tetradecyl groups.

Examples of the "cycloalkyl group" are cyclopropyl, cyclobutyl, cyclohexyl,

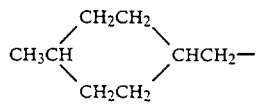

and

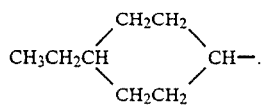

Examples of the "alkylether group" include CH₃OCH₂—, CH₃CH₂—O—CH₂CH₂—, CH₃CH₂CH₂—O—CH₂CH₂CH₂— and

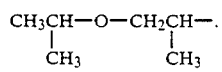

R₂ is preferably an alkyl group having 1 to 6 carbon atoms, especially a methyl group.

The "alkylene group" for R₃ may be linear or branched. Examples include —CH₂—, —CH₂CH₂—, —CH₂CH₂CH₂—,

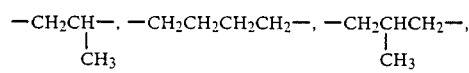

—CH₂CH₂CH₂CH₂CH₂— and
—CH₂CH₂CH₂CH₂CH₂CH₂—.

Examples of the "cycloalkylene group" include cyclopropylene, cyclobutylene, cyclohexylene and

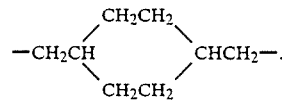

Examples of the "alkylene ether group" are —CH₂CH₂—O—CH₂CH₂—, —CH₂CH₂CH₂—O—CH₂CH₂CH₂—, and

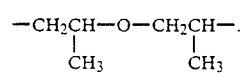

R₃ is preferably a linear alkylene group having 2 to 6 carbon atoms.

The positive-type photosensitive electro-deposition coating composition of this invention includes anionic or cationic compositions capable of forming a continuous film on an electrically conductive material by electrodeposition. When the continuous film is exposed, the exposed portion can be washed away with a developing solution.

The resin containing the modified quinone-diazide-sulfone units of general formula (I) used as a positive-type photosensitive component can be produced, for example, by the following methods.

First, a hydroxyl-containing quinone-diazide compound represented by the following formula

wherein R₁, R₂ and R₃ are as defined above, is produced by addition-reaction between quinone-diazidesulfonic acid and/or a quinonediazidesulfonyl halide (to be referred to as the "quinonediazide compound") represented by the following formula

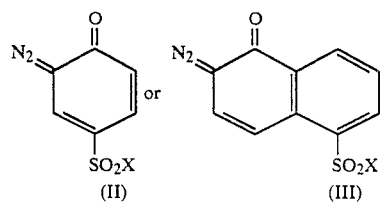

wherein X represent a hydrogen atom or a halogen atom such as Cl, F, Br and I, and a hydroxyl-containing amine compound of the following formula

wherein R₂ and R₃ are as defined above.

Where the resin containing the units of formula (I) is an anionic resin, it is produced, for example, by the following method.

(1) The hydroxyl-containing quinonediazide compound is reacted with an isocyanate-containing vinyl monomer to obtain a monomer (a), and the monomer (a) is copolymerized with an acid group-containing unsaturated monomer (b) and as required another unsaturated monomer (c).

(2) About 1 mole of the hydroxyl-containing quinonediazide compound and 1 mole of a diisocyanate compound are reacted, and the resulting isocyanate-containing quinonediazide compound is reacted with a resin containing one or more hydroxyl groups and one or more acid groups.

(3) The isocyanate-containing quinonediazide compound produced as in (2) is reacted with a hydroxyl-containing acrylic monomer. The resulting monomer is copolymerized with the monomer (b) and as required, the monomer (c).

(4) The hydroxyl-containing quinonediazide compound is reacted with a copolymer containing one or more acid groups and one or more isocyanate groups.

Where the resin containing the units of formula (I) is a cationic resin, it is produced by the following methods, for example.

(5) The monomer (a) is copolymerized with an unsaturated monomer (d) having a primary, secondary or tertiary amino group and as required, the monomer (c); or the monomer (a) is copolymerized with an unsaturated monomer (d') having a ketiminized amino group and as required, the monomer (c); or the monomer (a) is copolymerized with a glycidyl-containing unsaturated monomer (e) and as required, the monomer (c), and a secondary amine compound is reacted with the glycidyl groups of the resulting copolymer.

(6) An isocyanate-containing quinonediazide compound obtained by reacting 1 mole of the hydroxyl-containing quinonediazide compound with 1 mole of a diisocyanate compound is reacted with a hydroxyl-containing acrylic monomer. The resulting monomer is copolymerized with the monomer (d), the monomer (d') or the monomer (e) and as required, the monomer (c) as in the method (5). When the monomer (e) is used, the copolymer is reacted with the secondary amine compound as in the method (5).

(7) The isocyanate-containing quinonediazide compound obtained in (6) is reacted with a resin having one or more active hydrogen groups such as OH, NH or $NH_2$ and one or more tertiary amino or ketiminized amino groups.

(8) The hydroxyl-containing quinonediazide compound is reacted with a resin containing an isocyanate group and at least one functional group selected from a tertiary amino group, a ketiminized amino group and a glycidyl group Where a resin containing a glycidyl group is used, the secondary amine compound is reacted with the glcidyl groups of the reaction product.

The methods (1) and (4) are preferred for the preparation of the anionic resin, and the methods (5) and (8), for the preparation of the cationic resin.

Of the quinonediazide compounds of formula (II) or (III), 1,2-benzoquinonediazidesulfonyl chloride and 1,2-naphthoquinonediazide-5-sulfonyl chloride are preferred. Examples of preferred hydroxyl-containing amine compounds (4) include ethanolamine, neopentanolamine, 2-hydroxy-2'-aminoethyl ether, 2-hydroxy-2'-(amine-propoxy)ethyl ether, N-methylethanolamine, N-ethylethanolamine, N-propylethanolamine, N-methylpropanolamine, N-ethylpropanolamine, and N-propylpropanolamine. Of these, N-methylethanolamine and N-methylpropanolamine are preferred.

The reaction of the quinonediazide compound of formula (II) or (III) with the hydroxyl-containing amine compound of formula (IV) may be carried out in the presence of an inert organic solvent capable of dissolving or dispersing a mixture of the compound of formula (II) or (III) and the compound of formula (VI) at a temperature of generally room temperature to about 80° C., preferably room temperature to about 60° C., for a period of about 10 minutes to about 60 hours, preferably about 1 to 3 hours. The progress of the reaction can be monitored by measuring the amine value of the reaction mixture or by an infrared spectrum analysis.

Specific examples of the inert organic solvent that can be used in the above reaction include dioxanes such as dioxane and dioxolane; ketones such as acetone, methyl ethyl ketone and methyl isobutyl ketone; and aromatic hydrocarbons such as benzene, toluene and xylene. Of these, the dioxanes are preferred because they have an excellent ability to dissolve the quinonediazidesulfonyl halide and can be easily removed.

The ratio of the compound (II) or (III) and the compound of formula (IV) mixed is not particularly limited. Usually, it is suitable to mix them so that the mole ratio of the $-SO_2X$ group to the $>NH$ is about 1:1 to 1:2. In the above reaction, the $-SO_2X$ group of the quinonediazide compound reacts with the $>NH$ group of the hydroxyl-containing amine compound preferentially to the OH group. Hence, the main reaction product obtained by this reaction is the hydroxyl-containing quinonediazide compound represented by formula (V). To trap hydrogen halide formed during the reaction, the $>NH$ group may be used in excess, or the reaction may be carried out in the presence of a tertiary amine or an inorganic alkali such as sodium carbonate.

Preferred examples of the compound of formula (V) are given below.

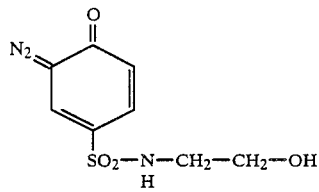

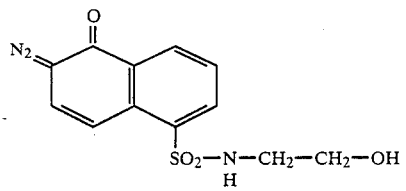

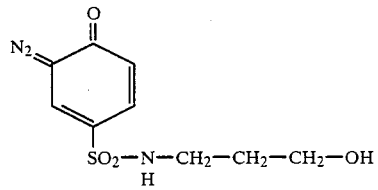

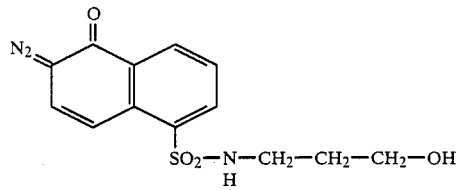

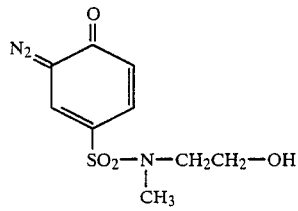

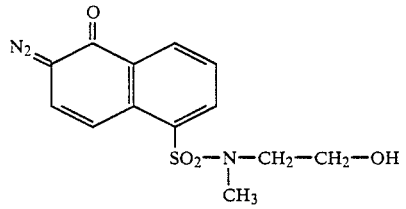

-continued

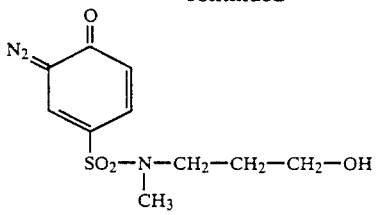

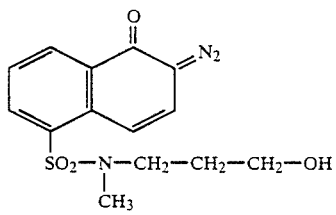

Examples of the isocyanate-containing vinyl monomer to be reacted with the hydroxyl-containing diazide compound in the method (1) are shown below.

(i) Monomers represented by the following general formula (VI)

wherein $R_4$ represents a hydrogen atom or a methyl group, and n is an integer of 1 to 8, such as isocyanate ethyl (meth)acrylate.

(ii) Monomers represented by the following general formula (VII)

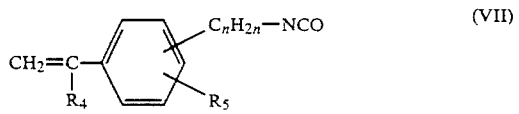

wherein $R_4$ and n are as defined above, and $R_5$ represents a hydrogen atom or an alkyl group having not more than 5 carbon atoms, such as m-propenyl-alpha,alpha-dimethylbenzyl isocyanate.

(iii) Monomers obtained by reacting 1 mole of a hydroxyl-containing (meth)acrylic ester monomer represented by the following general formula (VIII)

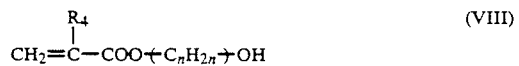

wherein $R_4$ and n are as defined above, with 1 mole of a diisocyanate compound.

Examples of the monomers represented by formula (VIII) are hydroxyalkyl (meth)acrylates, above all 2-hydroxyethyl (meth)acrylate and 2-hydroxypropyl (meth)acrylate. Examples of the diisocyanate compound include tolylene diisocyanate, methylcyclohexane 2,4-(or 2,6-)-diisocyanate, 1,3-diisocyanate methylcyclohexane, 1,6-hexamethylene diisocyanate, 4,4'-diphenylmethane diisocyanate, 4,4'-diphenylether diisocyanate, phenylene diisocyanate, naphthalene diisocyanate, biphenylene diisocyanate, 3,3'-dimethyl-4,4'-biphenylene diisocyanate, dicyclohexylmethane-4,4'-diisocyanate, p-xylylene diisocyanate, m-xylylene diisocyanate, bis(4-isocyanatephenyl)sulfone, isopropylidenebis(4-phenylisocyanate), lysine diisocyanate and isophorone diisocyanate. Of these, tolylene diisocyanate, m-xylylene diisocyanate, isophorone diisocyanate, methylcyclohexane 2,4-diisocyanate and 1,3-diisocyanatemethylcyclohexane having two isocyanate groups with different reactivities are preferred.

The above reaction of the isocyanate-containing vinyl monomer with the hydroxyl-containing quinonediazide compound may be carried out, for example, by maintaining these compounds in an isocyanate/hydroxyl mole ratio of about 1:1 in an inert organic solvent at a temperature of room temperature to about 80° C., preferably room temperature to about 60° C. for about 0.5 to 20 hours. The reaction can be monitored by measuring the isocyanate group in the vicinity of 2250 $cm^{-1}$ by infrared spectroscopy. The inert organic solvent may be one which does not react with the isocyanate group and the hydroxyl group, such as ketones, esters, aromatic hydrocarbons, aliphatic hydrocarbons and ethers. Preferably, the solvent is removed after the reaction and replaced by an alcoholic aqueous solvent.

Examples of the acid group-containing unsaturated monomer (b) and the other unsaturated monomer (c) to be copolymerized with the monomer (a) obtained by reacting the isocyanate-containing vinyl monomer with the hydroxyl-containing quinonediazide compound are shown below.

Specific examples of the acid group-containing unsaturated monomer (b) are (meth)acrylic acid, crotonic acid, itaconic acid, itaconic anhydride, maleic acid, maleic anhydride, fumaric acid and 2-hydroxyethyl acrylate acid phosphate. Acrylic acid and methacrylic acid are preferred. Examples of the monomer (c) used optionally include the hydroxyl-containing (meth)acrylates of general formula (VIII); $C_1$–$C_{26}$ alkyl or cycloalkyl esters of acrylic or methacrylic acid such as methyl (meth)acrylate, ethyl (meth)acrylate, n-butyl (meth)acrylate, i-butyl (meth)acrylate, tert-butyl (meth)acrylate, cyclohexyl (meth)acrylate, 2-ethylhexyl (meth)acrylate, lauryl (meth)acrylate and stearyl (meth)acrylate; acrylamides or methacrylamides such as (meth)acrylamide, N-methyl (meth)acrylamide, diacetoneacrylamide, N-methylol (meth)acrylamide and N-butoxymethylacrylamide; and vinyl monomers such as styrene, vinyl toluene, vinyl propionate, alpha-methylstyrene, vinyl acetate, (meth)acrylonitrile, vinyl propionate, vinyl pivalate and Veoba monomer (a product of Shell Chemical Co.).

The copolymerization of the above monomers is normally carried out by reacting a mixture of the above monomers in a suitable organic solvent in the presence of a radical-polymerizable initiator such as azobisisobutyronitrile or benzoyl peroxide at a temperature of about 30° to 180° C., preferably about 60° to 120° C., for a period of about 1 to 20 hours. Water-soluble organic solvents, especially alcohols and ethers, used in electrodeposition paints are suitable as the organic solvent. Examples include methanol, ethanol, n-propanol, isopropanol, butanol, ethylene glycol, butyl Cellosolve, ethyl Cellosolve, diethylene glycol, methylcarbitol, ethylene glycol dimethyl ether, and diethylene glycol dimethyl ether. The mixing ratio of the monomers is not strictly limited. Generally, the proportion of the monomer (a) obtained by reacting the isocyanate-containing vinyl monomer with the hydroxyl-containing quinonediazide is 5 to 98% by weight, preferably 10 to 70% by weight; the proportion of the acid group-containing unsaturated monomer (b) is 2 to 60% by weight, preferably 3 to 40% by weight; and the proportion of the other radical unsaturated monomer (c) is 0 to 90% by weight, preferably 10 to 70% by weight.

The same diisocyanate compounds as described with regard to the method (1) may be used as the diisocyanate compound to be reacted with the hydroxyl-containing quinonediazide compound in the method (2). Compounds having at least two isocyanate groups with different reactivities are preferred.

The reaction of the hydroxyl-containing quinonediazide compound with the diisocyanate compound may be carried out in the same way as in the reaction of the isocyanate-containing vinyl monomer with the hydroxyl-containing quinonediazide compound described with regard to the method (1).

Advantageously, the resin containing a hydroxyl group and an acid group to be reacted with the isocyanate-containing quinonediazide compound prepared by reacting the hydroxyl-containing quinonediazide compound and the isocyanate compound has a hydroxyl value of 10 to 100, preferably 30 to 80, and an acid value of 10 to 300, preferably 20 to 250. It may be any of those resins which are generally used in the field of paints, for example alkyd resins, polyester resins, acrylic resins and acid-modified epoxy resins.

The reaction of the isocyanate-containing quinonediazide compound with the resin may generally be carried out by maintaining these materials at room temperature to about 80° C., preferably room temperature to about 60° C., for a period of about 0.5 to 20 hours in the presence or absence of an inert organic solvent of the same type as described above with regard to the method (1).

In the method (3), the hydroxyl-containing acrylic monomer to be reacted with the same isocyanate-containing quinonediazide compound as described with regard to the method (2) may be selected from the monomers of general formula (VIII) described above with regard to the method (1).

The reaction of the isocyanate-containing quinonediazide compound with the hydroxyl-containing acrylic monomer may be carried out by maintaining the isocyanate-containing quinonediazide compound and the hydroxyl-containing acrylic monomer in an isocyanate/hydroxyl mole ratio of about 1:1 at room temperature to about 80° C., preferably room temperature to about 60° C., for a period of about 0.5 to 20 hours in the presence or absence of an inert organic solvent of the same type as described in the method (1).

The copolymer containing an isocyanate group and an acid group to be reacted with the hydroxyl-containing quinonediazide compound in the method (4) may preferably be a copolymer obtained by copolymerizing the same isocyanate-containing vinyl monomer as described with regard to the method (1) and the same unsaturated monomer (b) as used in the method (1) and optionally the other radical unsaturated monomer (c). The use of m-propenyl-alpha, alpha-dimethylbenzyl isocyanate having the isocyanate group bonded to the tertiary carbon as the isocyanate-containing vinyl monomer is convenient because the isocyanate does not react with the acid group of the unsaturated monomer (b) to be copolymerized and the isocyanate group can be accurately introduced into the resin without a likelihood of gellation or thickening.

The copolymerization reaction of the above monomers may be carried out by reacting these monomers in the same inert organic solvent incapable of reacting with the isocyanate group as described with regard to the method (1) at about 30° to 180° C., preferably about 60° to 120° C., for about 1 to 20 hours in the presence of a radical polymerization initiator such as 2,2'-azobisisobutyronitrile, 2,2'-azobis(2,4-dimethylvaleronitrile) or benzoyl peroxide.

The reaction of the above copolymer with the hydroxyl-containing quinonediazide compound may be carried out by maintaining the copolymer and the quinonediazide compound usually at room temperature to about 80° C., preferably room temperature to about 60° C., for about 0.5 to 20 hours. The solvent may be removed from the resulting solvent solution of the reaction product of the copolymer and the hydroxyl-containing quinonediazide compound, and replaced by a water-soluble organic solvent of the type described above for use in electrodeposition paints.

The monomer (d) having a primary, secondary or tertiary amino group and the unsaturated monomer (d') having a ketiminimzed amino group which are to be copolymerized with the monomer (a) in the method (5) may be exemplified as follows:

Examples of the monomer (d) are those represented by the following formula (IX).

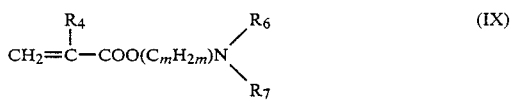

wherein m is an integer of 1 to 6, $R_4$ is as defined above, and each of $R_6$ and $R_7$ represents a hydrogen atom or an alkyl group having 1 to 4 carbon atoms.

Specific examples include aminoethyl (meth)acrylate, N-tert-butylaminoethyl (meth)acrylate, N,N-dimethylaminoethyl (meth)acrylate, N,N-diethylaminoethyl (meth)acrylate, N,N-dimethylaminopropyl (meth)acrylate and N,N-dimethylaminobutyl (meth)acrylate. Of these, N,N-dimethylaminoethyl (meth)acrylate, N,N-diethylaminoethyl (meth)acrylate, N,N-dimethylaminopropyl (meth)acrylate and N,N-dimethylaminobutyl (meth)acrylate are preferred.

The monomer (d') may be those obtained by ketiminizing monomers having a primary amino group such as aminoethyl (meth)acrylate with ketones.

Examples of the glycidyl-containing unsaturated monomer (e) are glycidyl (meth)acrylate, glycidyl (meth)acrylamide and allyl glycidyl ether. Examples of the secondary amine compound are lower dialkylamines such as dimethylamine, diethlamine and di-n-propylamine, dialkanolamines or dialkylalkanolamines such as diethanolamine, diisopropanolamine and N-methylethanolamine, and cyclic amines such as piperidine, morpholine and N-methylpiperazine.

The copolymerization of the above monomeric components may be carried out by a known method. For example, a mixture of the monomers is reacted at a temperature of about 30° to 180° C. for about 1 to 20 hours in the presence of a radical polymerization initiator such as azobismethoxybutyronitrile and benzoyl peroxide.

In the method (6), the same monomers and the same copolymerization reaction as in the method (5) may be used.

The resin which can be used in the method (7) is a resin having an active hydrogen group capable of reacting with the isocyanate group of the isocyanate-containing quinonediazide and a tertiary amino group which does not react with the isocyanate group but is dissociated in the presence of water to show cationic property or a ketiminized amino group. Examples are acrylic resins, epoxy resins and polyester resins.

The resin that can be used in the method (8) is a resin having an isocyanate group capable of reacting with the hydroxyl group of the hydroxyl-containing quinonediazide compound and a tertiary amino group which does not react with the isocyanate group but is dissociated in the presence of water to show cationic property or a ketiminized amino group, or an amine-adduct of a glycidyl group. Examples are acrylic resins, polyester resins and epoxy resins.

The anionic or cationic resins produced as described above contain an acid group or an amino group and modified quinonediazidesulfone units represented by the following formula (I)

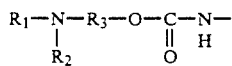  (I)

wherein $R_1$ represents

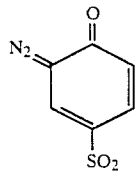

or

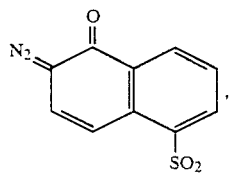

$R_2$ represents a hydrogen atom, an alkyl group, a cycloalkyl group or an alkyl ether group, and $R_3$ represents an alkylene group, a cycloalkylene group or an alkylene ether group, which are derived from the reaction product of the hydroxyl-containing quinonediazide compound with the isocyanate-containing compound or the resin.

The anionic or cationic resin used in this invention may contain the modified quinonediazidesulfone units of formula (I) in an amount of 5 to 60% by weight, preferably 10 to 50% by weight, based on the resin. Generally, if the amount of the modified quinonediazide-sulfone units is less than 5% by weight, the amount of the ketone in the exposed portion of the coated film formed from the resin and the amount of the carboxylic acid formed are small, and development with weak alkalies becomes difficult. On the other hand, if it is larger than 60% by weight, the glass transition temperature (Tg) of the resin becomes high, and the resulting electrodeposited film is hard and susceptible to cracking.

The anionic resin used in this invention has an acid value of 10 to 250, preferably 20 to 80, and the cationic resin used in this invention has an amine value of 30 to 250, preferably 40 to 150. Generally, if the acid value is less than 10 and the amine value is less than 30, it is difficult to make the resin water-soluble or water-dispersible, and an electrodeposition coating composition is difficult to prepare from the resin. If, on the other hand, the acid value and the amine value exceed 250, it is difficult to coat the resulting electrodeposition paint on a substrate.

The resin used in this invention generally may have a number average molecular weight of 3,000 to 100,000, preferably 5,000 to 30,000. If the number average molecular weight is lower than 3,000, a coated film prepared from the resin during electrodeposition tends to be broken and frequently, a uniform coated film cannot be obtained. If, on the other hand, it is higher than 100,000, the smoothness and levelness of the electrodeposited film are degraded and the coated surface tends to become uneven. Consequently, the resolution of line images tends to be reduced.

The positive-type photosensitive electro-deposition coating composition can be obtained by neutralizing the above resin having the specific modified ortho-quinonediazide group and the acid group or cationic group with an amine or an alkaline compound (when it contains the acid group) or with an organic or inorganic acid (when it contains the cationic group), and dispersing or dissolving the neutralized resin in water. Examples of the neutralizing agent used include alkanolamines such as monoethanolamine, diethanolamine and triethanolamine, alkylamines such as triethylamine, diethylamine, monoethylamine, diisopropylamine, trimethylamine methylamine and diisobutylamine, alkylalkanolamines such as dimethylaminoethanol, alicyclic amines such as cyclohexylamine, alkali metal hydroxide such as sodium hydroxide and potassium hydroxide, ammonia, and acids such as acetic acid, lactic acid and phosphoric acid. They may be used either singly or as a mixture.

A hydrophilic solvent may be added to the electrodeposition coating composition in order to increase the flowability of the water-solubilized or water-dispersed electrodeposition paint further. Examples of the hydrophilic solvent are isopropanol, n-butanol, t-butanol, methoxyethanol, ethoxyethanol, butoxyethanol, diethylene glycol methyl ether, dioxane and tetrahydrofuran. Generally, the amount of the hydrophilic solvent used is desirably not more than 300 parts by weight per 100 parts by weight of the resin.

To increase the amount of the coating composition coated on the substrate, a hydrophobic solvent may also be added to the composition. Examples of the hydrophobic solvent include petroleum solvents such as toluene and xylene, ketones such as methyl ethyl ketone and methyl isobutyl ketone, esters such as ethyl acetate and butyl acetate, and hydrophobic alcohols such as 2-ethyl-hexyl alcohol). Usually, the amount of the hydrophobic solvent is desirably not more than 200 parts by weight per 100 parts by weight of the resin.

As required, other resins may be incorporated to adjust the properties of the electrodeposited film. It is also possible to add a dye or a pigment.

A printed wiring board may be produced by the following procedure using the positive-type photosensitive electrodeposition coating composition.

An electrodeposition coating bath comprising the neutralized resin as a main component is adjusted to pH 5–10 (when the resin is anionic) or 3–9 (when the resin is cationic), a bath concentration (solids concentration) of 3 to 30% by weight, preferably 5 to 15% by weight, and a bath temperature of 15° to 40° C., preferably 15° to 30° C. A printed wiring substrate clad with a copper foil is immersed in the electrodeposition coating bath as an anode (in the case of anionic electrodeposition) or as a cathode (in the case of cationic electrodeposition), and a direct-current voltage of 20 to 400 V is applied. The time during which the current is passed is suitably 30 seconds to 5 minutes. The thickness of the coated film, after drying, is desirably 2 to 100 micrometers, preferably 3 to 20 micrometers.

After the electrodeposition coating, the substrate was withdrawn from the electrodeposition coating bath, and washed with water. Then, the water is removed from the electrodeposited film by heating or otherwise.

A pattern mask (photographic positive) was overlaid on the surface of the substrate coated with the photosensitive electrodeposited film, and portions other than the conductor circuit (circuit pattern) were exposed to actinic light such as ultraviolet light. The orthoquinonediazide compound in the exposed portions is converted to a carboxylic acid via a ketene, they can be removed by washing with a developer such as an aqueous alkaline solution to realize a high resolution.

The actinic light used for exposure in this invention preferably has a wavelength of 3000 to 4500 Å. Sources of this light are, for example, solar light, a mercury lamp, a xenon lamp and an arc light. Irradiation of the actinic light is carried out usually for 1 second to 20 minutes.

The developing treatment is carried out by spraying weakly alkaline water against the surface of the coated film to wash away the exposed portions of the coated film. The weakly alkaline water may be, for example, 0.1–1.0% sodium hydroxide, potassium hydroxide, 0.5–3% sodium carbonate or aqueous ammonia, which neutralizes the free carboxylic acid in the coated film to make it water-soluble.

The copper foil portion (non-circuit portion) exposed on the substrate by the development is removed by an ordinary etching treatment using a ferric chloride or copper chloride solution, for example. Then, the unexposed coated film on the circuit pattern is removed by dissolving with a Cellosolve-type solvent such as ethyl Cellosolve and ethyl Cellosolve acetate, an aromatic hydrocarbon solvent such as toluene and xylene, a ketone-type solvent such as methyl ethyl ketone and methyl isobutyl ketone, an acetate-type solvent such as ethyl acetate and butyl acetate, or a chlorine-type solvent such as trichloroethylene, or also with 3–10% sodium hydroxide or potassium hydroxide in the case of using an anionic electrodeposition paint, or also with an organic acid such as acetic acid or lactic acid in the case of using a cationic electrodeposition paint.

The positive-type photosensitive electro-deposition coating composition can be easily coated on a copper foil by electrodeposition, and the electro-deposited film is dried to form a uniform photosensitive film. When light is irradiated onto the photosensitive film through a positive film, the exposed portion changes as described above and is developed with weakly alkaline water. The unexposed portion can also be removed by dissolving with the solvent, strong alkalies (in the case of using the anionic paint) or the acid (in the case of using the cationic paint). Accordingly, this can supersede conventional photosensitive films.

The electrodeposition coating composition of this invention is particularly suitable for the production of a printed circuit board having through-holes. This composition obviates a soldering step unlike the case of using a photosensitive dry film, and shortens the process of producing the printed circuit board. With a photocurable negative-type electrodeposition paint, it is difficult to form a cured film on through-holes of small diameters. In contrast, since the unexposed portion remains as a resist film in the present invention, the composition of this invention is suitable for the production of printed circuit board having through-holes of a small diameter.

Furthermore, since the positive-type photosensitive electrodeposition coating composition of this invention uses a resin having introduced thereinto guinonediazide groups through sulfonamide (or imide) linkages and urethane linkages as a main vehicle component, the resin is difficult of hydrolysis in an aqueous solution or dispersion, the electrodeposition paint does not flocculate nor sediment to the bottom of the bath, nor the coating voltage varies greatly, over an extended period of time. The electrodeposition coating bath can therefore be easily controlled.

The following examples illustrate the present invention more specifically. All parts and percentages in these examples are by weight.

Production of a hydroxyl-containing ortho-quinonediazide compound 1

A four-necked flask was charged with 269 parts of ortho-naphthoquinonediazidesulfonyl chloride and 1345 parts of dioxane, and with stirring at room temperature, 150 parts of N-methylethanolamine was added dropwise over 1 hour. After the dropwise addition, the mixture was stirred further for about 3 hours. After determining that the absorption of the amino group near 3300 cm$^{-1}$ the IR spectrum of the reaction mixture disappeared, the reaction was terminated.

The resulting solution was put in deionized water, and the quaternary amine which trapped hydrochloric acid formed during the reaction was removed. The product was then extracted with isobutyl acetate, and the solvent was evaporated. The residue was dried in a desiccator under reduced pressure to give a hydroxyl-containing ortho-quinonediazide compound 1.

Production of a hydroxyl-containing ortho-qinonediazide compound 2

A four-necked flask was charged with 269 parts of ortho-naphthoquinonediazidesulfonyl chloride and 1345 parts of dioxane, and with stirring at room temperature, 122 parts of monoethanolamine was added over the course of 1 hour. After the dropwise addition, the mixture was further stirred for about 3 hours, and then worked up as in the production of the quinonediazide compound 1. As a result, a hydroxyl-containing ortho-quinonediazide compound 2 was obtained.

Production of an unsaturated compound 1

In a four-necked flask was put 444 parts of isophorone diisocyanate, and heated to 80° C. Then, 232 parts of hydroxyethyl acrylate was added dropwise over the course of 2 hours. The mixture was maintained for 6 hours to give an unsaturated compound 1.

Production of an unsaturated compound 2

In a four-necked flask was put 354 parts of tolylene diisocyanate, and heated to 80 ° C. Then, 232 parts of hydroxyethyl acrylate was added dropwise over the course of 2 hours. The mixture was maintained for 6 hours to give an unsaturated compound 1.

Production of an unsaturated compound 3

A four-necked flask was charged with 1535 parts of methyl isobutyl ketone and 307 parts of the hydroxyl-containing ortho-quinonediazide compound 1. The temperature was raised to 50° C., and 201 parts of m-isopropenyl-alpha, alpha-dimethylbenzyl isocyanate was added dropwise over 2 hours. The mixture was maintained for 8 hours to give an unsaturated compound 3.

Production of an unsaturated compound 4

A four-necked flask was charged with 529 parts of an isocyanate-containing compound (the production of which is shown below), 130 parts of 2-hydroxyethyl methacrylate and 0.07 part of dibutyl tin diacetate, and these compounds were stirred for 3 hours. It was determined that the absorption of the isocyanate group near 2250 $cm^{-1}$ in the IR spectrum disappeared. Thus, an unsaturated compound 4 was obtained.

Production of an isocyanate-containing compound

A four-necked flask was charged with 307 parts of the hydroxyl-containing ortho-quinonediazide compound 1 and 222 parts of isophorone diisocyanate. They were stirred at 50° C. for 5 hours to give an isocyanate-containing compound.

EXAMPLE 1

A four-necked flask was charged with 290 parts of diethylene glycol dimethyl ether, and with stirring the temperature was raised to 110° C. Then, a mixture of 202 parts of n-butyl methacrylate, 24 parts of acrylic acid, 92 parts of m-isopropenyl-alpha,alpha-dimethylbenzyl isocyanate and 20 parts of azobisbutyrovaleronitrile was added dropwise over the course of 3 hours. The mixture was maintained for 1 hour, and a mixture of 14 parts of methyl isobutyl ketone and 3 parts of azobisbutyrovaleronitrile was added dropwise over 1 hour. The mixture was further maintained for 2 hours. Thereafter, the temperature was lowered to 50° C., and 142 parts of the hydroxyl-containing ortho-quinonediazide compound 1 and 4.6 parts of dibutyltin diacetate were added. The mixture was maintained for 3 hours at 50° C. It was determined that the absorption of the isocyanate group near 2250 $cm^-$ in the infrared spectrum disappeared, and a positive-type photosensitive resin (acid value 40.7) having a viscosity of E and a molecular weight of 7,000 was obtained. Triethylamine (33 parts) was added to the resulting solution of the photosensitive resin, and the resin was fully neutralized. Deionized water was added to provide a solids content of 10 % and thus, an electrodeposition coating bath (pH 8.0) was obtained.

EXAMPLES 2-13

In each run, a positive-type photosensitive resin was synthesized as in Example 1 in accordance with the recipes shown in Table 1. Then, the resin was neutralized with a neutralizing agent to prepare an electrodeposition coating bath.

In Example 6, a photosensitive resin was synthesized at a reaction temperature of 60° C., and in Example 7, a photosensitive resin was synthesized at a reaction temperature of 80° C.

Diethylamine used in Example 13 was reacted with a glycidyl-containing resin prepared in advance at a reaction temperature of 80° C. for 4 hours.

TABLE 1

| | | 2 | 3 | 4 | 5 | 6 | 7 | 8 | 9 | 10 | 11 | 12 | 13 |
|---|---|---|---|---|---|---|---|---|---|---|---|---|---|
| Starting material | n-Butyl methacrylate | 185 | 185 | 185 | 185 | 185 | 122 | 337 | 262 | 265 | 137 | 255 | 258 |
| | Acrylic acid | 41 | 41 | 41 | 41 | 41 | 36 | | | | | | |
| | m-Isopropenyl-α,α-dimethyl-benzyl isocyanate | 92 | 92 | | | | | 178 | 178 | 172 | | | 165 |
| | Dimethylaminoethyl methacrylate | | | | | | | 99 | 174 | 167 | 169 | 169 | |
| | Glycidyl methacrylate | | | | | | | | | | | | 145 |
| | Unsaturated compound 1 | | | 155 | | | | | | | 291 | | |
| | Unsaturated compound 2 | | | | 130 | | | | | | | | |
| | Unsaturated compound 3 | | | | | 233 | | | | | | 437 | |
| | Unsaturated compound 4 | | | | | | 305 | | | | | | |
| | OH-containing ortho-quinonediazide compound 1 | 142 | | 142 | 142 | | | 272 | 272 | | 264 | | 251 |
| | OH-containing ortho-quinonediazide compound 2 | | 136 | | | | | | | 250 | | | |
| | Diethylamine | | | | | | | | | | | | 74 |
| Catalyst | Azobisbutyrovaleronitrile | 20 | 20 | 20 | 20 | | | 37 | 37 | 36 | 36 | 36 | 34 |
| | Azobismethoxydimethyl-valeronitrile | | | | | 28 | 14 | | | | | | |
| | Additional catalyst (the above catalyst) | 3 | 3 | 3 | 3 | 3 | 2 | 6 | 6 | 6 | 6 | 6 | 6 |
| | Dibutyl tin acetate | 4.6 | 4.6 | 4.6 | 4.6 | | | 9 | 9 | 9 | 9 | 9 | 9 |
| Solvent | Diethylene glycol dimethyl ether | 290 | 290 | 290 | 290 | 290 | 315 | 584 | 584 | 574 | 567 | 567 | 537 |
| Photosensitive resin | Acid value | 69.4 | 69.4 | 61.1 | 64.1 | 69.6 | 60.0 | | | | | | |
| | Amine value | | | | | | | 39.9 | 70.2 | 69.9 | 70.1 | 70.1 | 64 |
| | Viscosity | N | M | X | Z | N | W | O | R | Q | Y | Z | N |
| | Molecular weight | 7600 | 7300 | 7300 | 6800 | 7000 | 7800 | 7200 | 7600 | 7400 | 7500 | 6900 | 7400 |
| Neutralizing agent | Triethylamine | 57 | 57 | 57 | 57 | 57 | 38 | | | | | | |
| | Acetic acid | | | | | | | 37 | 37 | 37 | 37 | 37 | 37 |
| Electrodeposition bath | Solids content (wt. %) | 10 | 10 | 10 | 10 | 10 | 10 | 10 | 10 | 10 | 10 | 10 | 10 |
| | pH | 8.2 | 8.2 | 8.2 | 8.2 | 8.2 | 8.2 | 6.5 | 6.7 | 6.7 | 6.8 | 6.7 | 6.6 |

COMPARATIVE EXAMPLE 1

Example 6 was repeated except that a quinone-diazidesulfonic acid ester (obtained by esterifying an equimolar adduct of glycidyl methacrylate and hydroxybenzoic acid with 1 mole of quinonediazidesulfonyl chloride) was used in place of the unsaturated monomer 3. A solution of a positive-type photosensitive resin (acid value 69.3, average molecular weight 7,000) was obtained.

An electrodeposition coating bath (pH 8.1) having a solids content of 10 % was prepared by using the resulting positive-type photosensitive resin solution in the same way as in Example 1.

COMPARATIVE EXAMPLE 2

An electrodeposition coating bath (pH 6.7) having a solids content of 10 % was prepared in the same way as in Example 12 except that the quinone-diazidesulfonic acid ester used in Comparative Example 1 was used instead of the unsaturated monomer 3.

Production of printed circuit boards

A copper-clad laminated plate (240×170×1.5 mm) for printed wiring having through-holes was immersed in each of the electrodeposition coating baths obtained in Examples 1 to 13 as an anode (Examples 1 to 7) or as a cathode (Examples 8 to 13). The bath temperature was maintained at 25° C., and a direct-current voltage of 100 V was applied for 3 minutes to effect electrodeposition. The coated film was washed with water, and dried at 50° C. for 5 minutes to form a non-tacky smooth photosensitive film having a thickness of 5 microns. A positive film was brought into intimate contact with the surface of the electrodeposited film by using a vacuum device, and by using a 3 KW ultrahigh pressure mercury lamp, both surface of the laminated plate were irradiated at 150 mJ/cm². The exposed portion was then washed with a 3 % aqueous solution of sodium carbonate. After washing with an aqueous solution of ferric chloride, the copper foil was removed by etching, and the unexposed portion was removed by using ethylene glycol monoethylene ether as a solvent. A printed circuit board having a clear sharp pattern with the copper foil attached also to the through-hole portion was obtained.

Each of the electrodeposition coating baths obtained in Examples 1 to 13 was subjected to a storage acceleration test at 30° C. for 3 months, and then changes in the appearance of the coating baths were examined. No change such as sedimentation or flocculation of the resin component was seen in these coating baths. Using the coating baths subjected to the storage acceleration test, printed circuit boards were produced by the same method as above. The resulting printed circuit boards had a clear sharp pattern with the copper foil attached to the through-hole portion.

When the electrodeposition coating baths obtained in Comparative Examples 1 and 2 were subjected to the same storage acceleration test at 30° C. for 3 months, the resin component sedimented and flocculated at the bottom of the coating baths. Even when the baths were stirred, they did not return to the original state. Using the coating baths subjected to the storage acceleration test, printed circuit boards were produced by the same method as above. The exposed portion was difficult of development with an aqueous solution of sodium carbonate and had poor developability. Printed circuit boards having a sharp pattern could not be obtained.

We claim:

1. A positive-type photosensitive electrodeposition coating composition comprising as a main component a water-soluble or water-dispersible resin containing modified quinonediazidesulfone units represented by the following formula (I)

wherein $R_1$ represents

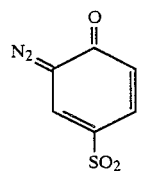

or

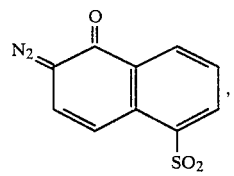

$R_2$ represents a hydrogen atom, an alkyl group, a cycloalkyl group or an alkyl ether group, and $R_3$ represents an alkylene group, a cycloalkylene group or an alkylene ether group, in the molecule.

2. The composition of claim 1 in which $R_2$ is an alkyl group having 1 to 6 carbon atoms.

3. The composition of claim 2 in which $R_2$ is a methyl group.

4. The composition of claim 1 in which $R_3$ is a linear alkylene group having 2 to 6 carbon atoms.

5. The composition of claim 1 in which the modified quinonediazidesulfone units represented by formula (I) are obtained by the reaction of the isocyanate groups in the resin with a hydroxyl-containing quinonediazide compound represented by the following formula

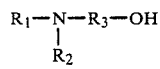

wherein $R_1$, $R_2$ and $R_3$ are as defined.

6. The composition of claim 5 in which the hydroxyl-containing quinonediazide compound is selected from

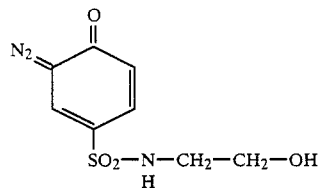

-continued

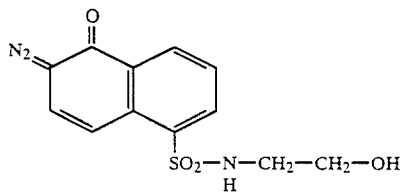

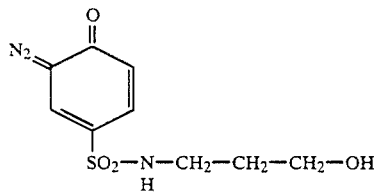

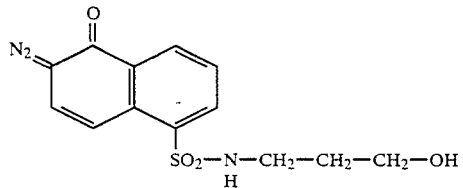

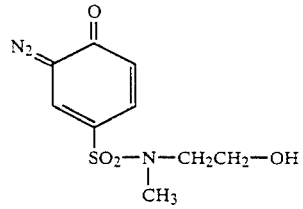

-continued

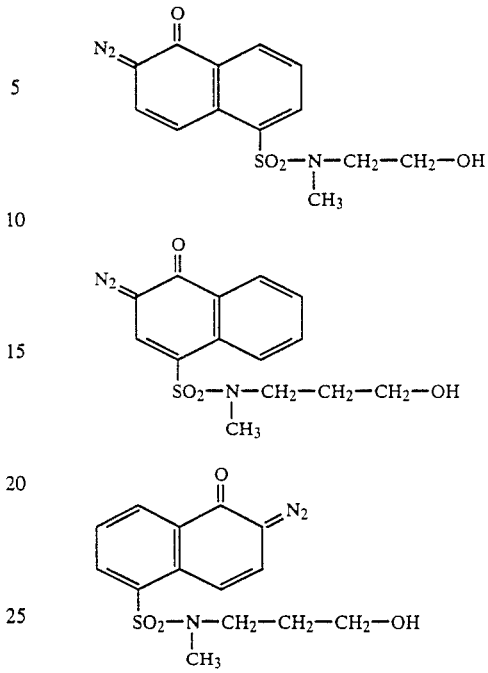

7. The composition of claim 1 in which the water soluble or water-dispersible resin contains 5 to 60% by weight, based on the resin, of the modified quinone-diazidesulfonic acid units represented by formula (I).

8. The composition of claim 1 in which the water-soluble or water-dispersible resin has a number average molecular weight of 3,000 to 100,000.

9. The composition of claim 1 in which the water-soluble or water-dispersible resin has an acid value of 10 to 250 (mg KOH g resin).

10. The composition of claim 1 in which the water-soluble or water-dispersible resin is a cationic resin having an amine value of 30 to 250.

11. The composition of claim 1 which further comprises not more than 300 parts by weight, per 100 parts by weight of the resin, of a hydrophilic solvent.

12. The composition of claim 1 which further comprises not more than 200 parts by weight, per 100 parts by weight of the resin, of a hydrophobic solvent.

* * * * *